United States Patent
Yamaguchi et al.

(10) Patent No.: US 11,575,190 B2
(45) Date of Patent: Feb. 7, 2023

(54) TRANSMISSION PATH FOR TRANSMITTING HIGH-FREQUENCY SIGNALS GREATER THAN 14GHZ, WHERE THE TRANSMISSION PATH INCLUDES A NICKEL-PHOSPHOROUS LAYER WITH PHOSPHOROUS CONCENTRATIONS BETWEEN 0 MASS% TO 8 MASS%

(71) Applicant: FURUKAWA ELECTRIC CO., LTD., Tokyo (JP)

(72) Inventors: Fumie Yamaguchi, Tokyo (JP); Satoru Torimitsu, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 710 days.

(21) Appl. No.: 16/419,567

(22) Filed: May 22, 2019

(65) Prior Publication Data

US 2019/0273300 A1    Sep. 5, 2019

Related U.S. Application Data

(63) Continuation-in-part of application No. PCT/JP2017/041167, filed on Nov. 15, 2017.

(30) Foreign Application Priority Data

Nov. 25, 2016 (JP) .............................. JP2016-229605
Nov. 25, 2016 (JP) .............................. JP2016-229606

(51) Int. Cl.
*H01P 3/08* (2006.01)
*H01Q 1/38* (2006.01)
(Continued)

(52) U.S. Cl.
CPC ............... *H01P 3/081* (2013.01); *H01B 1/02* (2013.01); *H01P 3/08* (2013.01); *H01Q 1/38* (2013.01); *H01Q 1/48* (2013.01); *H05K 1/09* (2013.01)

(58) Field of Classification Search
CPC ................................... H01B 1/02; H01P 3/00
(Continued)

(56) References Cited

U.S. PATENT DOCUMENTS 6,127,052 A    10/2000   Tomari et al.
9,006,898 B2    4/2015   Hampp et al.
(Continued)

FOREIGN PATENT DOCUMENTS

CN    102222623 A    10/2011
CN    103369825 A    10/2013
(Continued)

OTHER PUBLICATIONS

Extended European Search Report dated Apr. 21, 2020, in Patent Application No. 17874546.9, 8 pages.
(Continued)

*Primary Examiner* — Benny T Lee
(74) *Attorney, Agent, or Firm* — Oblon, McClelland, Maier & Neustadt, L.L.P.

(57) ABSTRACT

In a transmission path transmitting high-frequency signals each signal contains a frequency component of over 8 GHz. The transmission path includes a nickel-phosphorus layer containing nickel and phosphorus, and a phosphorus concentration of the nickel-phosphorus layer is over 0 mass % and less than 8 mass %. Such a structure enables the transmission path to have little loss even when a signal at a frequency of over 8 GHz is transmitted.

17 Claims, 20 Drawing Sheets

(51) Int. Cl.
*H01Q 1/48* (2006.01)
*H05K 1/09* (2006.01)
*H01B 1/02* (2006.01)

(58) Field of Classification Search
USPC ......................................................... 333/236
See application file for complete search history.

(56) References Cited

U.S. PATENT DOCUMENTS

| | | |
|---|---|---|
| 2011/0256668 A1 | 10/2011 | Urano |
| 2013/0257682 A1 | 10/2013 | Yoshida et al. |

FOREIGN PATENT DOCUMENTS

| | | |
|---|---|---|
| CN | 104125711 A | 10/2014 |
| DE | 39 06 587 A1 | 9/1990 |
| JP | 8-32207 | 2/1996 |
| JP | 11-330652 | 11/1999 |
| JP | 2001-144392 A | 5/2001 |
| JP | 2005-179695 A | 7/2005 |
| JP | 2006-121034 | 5/2006 |

OTHER PUBLICATIONS

Japanese Office Action dated Mar. 23, 2021 in Japanese Patent Application No. 2018-552531 (with unedited computer generated English translation), 8 pages.
Combined Chinese Office Action and Search Report dated Oct. 28, 2020, in Chinese Patent Application No. 201780071984.4 (with English translation), 20 pages.
International Search Report dated Jan. 30, 2018 in PCT/JP2017/041167, filed on Nov. 15, 2017.
European Office Action dated Nov. 22, 2021 in European Patent Application No. 17 874 546.9, 7 pages.
Combined Chinese Office Action and Search Report dated May 28, 2021 in Chinese Patent Application No. 201780071984.4 (with English translation), 25 pages.
Decision of Rejection dated Jan. 21, 2022 in Chinese Patent Application No. 201780071984.4 (with English machine translation), 16 pages.

| TRANSMISSION LOSS (dB/10cm) | 2GHz | 8GHz | 20GHz | 40GHz | 60GHz |
|---|---|---|---|---|---|
| PHOSPHORUS CONTENT CONCENTRATION 6.1% | -1.0dB | -2.3dB | -4.2dB | -6.6dB | -8.7dB |
| PHOSPHORUS CONTENT CONCENTRATION 6.6% | -0.9dB | -2.3dB | -4.4dB | -6.9dB | -9.0dB |
| PHOSPHORUS CONTENT CONCENTRATION 7.9% | -0.9dB | -2.3dB | -4.6dB | -7.3dB | -9.5dB |
| PHOSPHORUS CONTENT CONCENTRATION 9.1% | -0.7dB | -2.3dB | -4.7dB | -7.5dB | -10.1dB |
| PHOSPHORUS CONTENT CONCENTRATION 10.9% | -0.7dB | -2.3dB | -4.9dB | -7.8dB | -10.3dB |
| PHOSPHORUS CONTENT CONCENTRATION 12.0% | -0.7dB | -2.3dB | -5.0dB | -8.0dB | -10.5dB |

FIG. 3

| EYE-OPENING HEIGHT (Vpp) | 16Gbaud | 28Gbaud | 32Gbaud | 40Gbaud |
|---|---|---|---|---|
| PHOSPHORUS CONTENT CONCENTRATION 6.1% | 0.6 | 0.5 | 0.5 | 0.3 |
| PHOSPHORUS CONTENT CONCENTRATION 6.6% | 0.6 | 0.5 | 0.4 | 0.3 |
| PHOSPHORUS CONTENT CONCENTRATION 7.9% | 0.6 | 0.5 | 0.4 | 0.3 |
| PHOSPHORUS CONTENT CONCENTRATION 12.0% | 0.6 | 0.4 | 0.3 | 0.2 |

FIG. 5

| GAIN (dBi) | 48GHz |
|---|---|
| PHOSPHORUS CONTENT CONCENTRATION 6.1% | 26.4 |
| PHOSPHORUS CONTENT CONCENTRATION 6.6% | 26.3 |
| PHOSPHORUS CONTENT CONCENTRATION 7.9% | 26.1 |
| PHOSPHORUS CONTENT CONCENTRATION 12.0% | 25.8 |

FIG. 11

| TRANSMISSION LOSS (dB/10cm) | 2GHz | 8GHz | 20GHz | 40GHz | 60GHz |
|---|---|---|---|---|---|
| PHOSPHORUS CONTENT CONCENTRATION 0.0% | -3.4dB | -7.9dB | -11.3dB | -16.7dB | -21.9dB |
| PHOSPHORUS CONTENT CONCENTRATION 2.12% | -1.3dB | -2.3dB | -3.8dB | -6.3dB | -8.4dB |
| PHOSPHORUS CONTENT CONCENTRATION 4.04% | -1.7dB | -2.3dB | -4.4dB | -7.1dB | -9.4dB |
| PHOSPHORUS CONTENT CONCENTRATION 6.79% | -0.7dB | -2.3dB | -4.8dB | -7.6dB | -9.9dB |
| PHOSPHORUS CONTENT CONCENTRATION 10.36% | -0.6dB | -2.3dB | -4.9dB | -7.9dB | -10.3dB |

FIG. 17

| EYE-OPENING HEIGHT (Vpp) | 16Gbaud | 28Gbaud | 32Gbaud | 40Gbaud |
|---|---|---|---|---|
| PHOSPHORUS CONTENT CONCENTRATION 0.0% | 0.3 | 0.2 | 0.2 | 0.1 |
| PHOSPHORUS CONTENT CONCENTRATION 2.12% | 0.6 | 0.6 | 0.6 | 0.4 |
| PHOSPHORUS CONTENT CONCENTRATION 4.04% | 0.6 | 0.5 | 0.4 | 0.4 |
| PHOSPHORUS CONTENT CONCENTRATION 6.79% | 0.6 | 0.5 | 0.4 | 0.3 |
| PHOSPHORUS CONTENT CONCENTRATION 10.36% | 0.6 | 0.4 | 0.3 | 0.2 |

FIG. 18

| GAIN (dBi) | 48GHz |
|---|---|
| PHOSPHORUS CONTENT CONCENTRATION 0.0% | 18.5 |
| PHOSPHORUS CONTENT CONCENTRATION 2.12% | 27.3 |
| PHOSPHORUS CONTENT CONCENTRATION 4.04% | 26.7 |
| PHOSPHORUS CONTENT CONCENTRATION 6.79% | 26.3 |
| PHOSPHORUS CONTENT CONCENTRATION 10.36% | 25.9 |

FIG. 19

| ORDER | PROCESS | CHEMICAL LIQUID | CONCENTRATION | TEMPERATURE | TIME |
|---|---|---|---|---|---|
| (1) | IMMERSION DEGREASING PROCESS | DEGREASING LIQUID | 150ml/L | 40°C | 4 MINUTES |
| (2) | ACID DEGREASING PROCESS | ACID DEGREASING LIQUID | 150ml/L | 40°C | 4 MINUTES |
| (3) | SOFT-ETCHING PROCESS | PERSULFURIC ACID SODA | 100g/L | 25°C | 30 SECONDS |
| (4) | DESMUTTING PROCESS | 98% SULFURIC ACID | 100ml/L | 25°C | 30 SECONDS |
| (5) | PRE-DIPPING PROCESS | 35% HYDROCHLORIC ACID | 100ml/L | 25°C | 30 SECONDS |
| (6) | CATALYST ADDITION PROCESS | CATALYST LIQUID | 200ml/L | 25°C | 30 SECONDS |
| (7) | ELECTROLESS Ni-P PLATING PROCESS | | | | |
| (8) | ELECTROLESS Au PLATING PROCESS | | | | |
| (9) | DRYING PROCESS | | | | |

FIG. 20

TRANSMISSION PATH FOR TRANSMITTING HIGH-FREQUENCY SIGNALS GREATER THAN 14GHZ, WHERE THE TRANSMISSION PATH INCLUDES A NICKEL-PHOSPHOROUS LAYER WITH PHOSPHOROUS CONCENTRATIONS BETWEEN 0 MASS% TO 8 MASS%

CROSS-REFERENCE TO RELATED APPLICATIONS

The present application is a continuation-in-part of PCT/JP2017/041167 filed Nov. 15, 2017 and claims priority to Japanese Patent Application Nos. 2016-229605 filed Nov. 25, 2016 and 2016-229606 filed Nov. 25, 2016. The entire contents of each of which are incorporated herein by reference.

TECHNICAL FIELD

The present invention relates to a transmission path.

BACKGROUND ART

In recent years, a technology relating to a wiring substrate where semiconductor elements or the like are mounted has attracted attention due to increased speed and increased capacity of communication. Copper is usually used for a transmission path of the wiring substrate, and there is a case when a nickel-phosphorus layer is deposited on a surface of copper, and a gold layer is further deposited on a surface of the nickel-phosphorus layer.

In recent years, in an antenna device dealing with millimeter waves and microwaves, a microstrip antenna, excellent in mass productivity and economic efficiency, is widely used because the microstrip antenna is possible to be formed in a planar shape on a substrate by using an integrated-circuit technology or a printed-wiring technology.

Copper is usually used for a radiation element and a ground conductor plate of the microstrip antenna. There is a case when a structure where a nickel-phosphorus layer and a gold layer are sequentially deposited on copper is used. The microstrip antenna transmits and receives high-frequency signals in millimeter-wave and microwave bands through the radiation element.

Patent Document 1 discloses a technology where a loss of a high-frequency signal is reduced by setting a concentration of phosphorus of the nickel-phosphorus layer to 8 to 15% to cause non-magnetization of nickel. It is possible to improve transmission characteristics and gain at a transmission/reception time also in the transmission path and the antenna device due to the technology as stated above.

PRIOR ART DOCUMENT

Patent Document

Patent Document 1: Japanese Patent Application Publication No. 2001-144392 which was published on May 25, 2001.

DISCLOSURE OF THE INVENTION

Problems to be Solved by the Invention

It became clear through actual measurement performed by the present inventors that a loss increases when a frequency of a signal is over 8 GHz 15 according to the technology disclosed in Patent Document 1.

The present invention is made in consideration of the aforementioned circumstances, and an object of the present invention is to provide a transmission path with little loss even when a signal at a frequency of over 8 GHz is used.

Means for Solving the Problems

To solve the aforementioned problems, the present invention is characterized in that in a transmission path transmitting high-frequency signals with each signal containing a frequency component of over 8 GHz, the transmission path includes a nickel-phosphorus layer containing nickel and phosphorus, and the nickel-phosphorus layer has a phosphorus concentration of over "0" (zero) mass % and less than 8 mass %. Such a structure makes it possible to provide a transmission path with little loss, even when a signal at a frequency of over 8 GHz is transmitted.

Such a structure makes it possible to provide a transmission path with little loss even when a signal at a frequency of over 8 GHz is transmitted.

The present invention is characterized in that the concentration of phosphorus of the nickel-phosphorus layer is 6 mass % or less.

Such a structure makes it possible to reduce the loss when the signal at the frequency of over 8 GHz is transmitted.

The present invention is characterized in that the concentration of phosphorus of the nickel-phosphorus layer is 4 mass % or less. Such a structure makes it possible to reduce the loss, when the signal at the frequency of over 8 GHz is transmitted.

The present invention is characterized in that the concentration of phosphorus of the nickel-phosphorus layer is 3 mass % or less. Such a structure makes it possible to more reduce the loss, when the signal at the frequency of over 8 GHz is transmitted.

The present invention is characterized in that the concentration of phosphorus of the nickel-phosphorus layer is 0.5 mass % or more. Such a structure makes it possible to more reduce the loss, when the signal at the frequency of over 8 GHz is transmitted.

The present invention is characterized in that the concentration of phosphorus of the nickel-phosphorus layer is 1.0 mass % or more. Such a structure makes it possible to more reduce the loss, when the signal at the frequency of over 8 GHz is transmitted.

The present invention is characterized in that the transmission path includes a conductor layer, and the nickel-phosphorus layer is formed on a surface of the conductor layer.

Such a structure makes it possible to reduce the loss of the signal at the frequency of over 8 GHz transmitted through the transmission path formed on a wiring substrate.

The present invention is characterized in that the nickel-phosphorus layer is formed on a surface of a dielectric substrate.

Such a structure makes it possible to reduce the loss of the signal at the frequency of over 8 GHz transmitted through the transmission path formed on a wiring substrate.

It is characterized in that the conductor layer is formed of copper.

Such a structure makes it possible to reduce the loss while reducing cost by using copper which has high conductivity and inexpensive as the conductor layer.

The present invention is characterized in that a gold layer formed on a surface of the nickel-phosphorus layer is included. Such a structure makes it possible to prevent transmission loss increases due to oxidation of the transmission path, and such a structure is suitable for mounting semiconductor elements or the like.

The present invention is characterized in that a digital signal having a transmission speed of over 16 Gbaud is transmitted through the transmission path.

Such a structure makes it possible to prevent deterioration of the digital signal.

The present invention is characterized in that the nickel-phosphorus layer is formed on an inner surface of a waveguide.

Such a structure makes it possible to reduce the loss of electromagnetic waves of over 8 GHz.

The present invention is characterized in that the nickel-phosphorus layer is formed by electroless plating.

Such a structure makes it possible to uniformly form the nickel-phosphorus layer.

The present invention is characterized in that at least a radiation element of an antenna device including: the radiation element transmitting/receiving the high-frequency signals; a ground conductor plate disposed adjacent to the radiation element; and a power feeding part feeding electric power to the radiation element or receiving electric power from the radiation element.

Such a structure makes it possible to reduce the loss of the antenna device.

The present invention is characterized in that in a transmission path transmitting high-frequency signals with each signal containing a frequency component 15 of over 8 GHz, a nickel-phosphorus layer containing nickel and phosphorus, wherein a phosphorus concentration of the nickel-phosphorus layer is over 0 mass % and 3 mass % or less. Such a structure makes it possible to provide a transmission path with little loss even, when a signal at a frequency of over 8 GHz is transmitted.

The present invention is characterized in that in a transmission path transmitting high-frequency signals with each signal containing a frequency component of over 8 GHz, a nickel-phosphorus layer containing nickel and phosphorus, wherein a phosphorus concentration of the nickel-phosphorus layer is over 0 mass % and less than 8 mass %, and the nickel-phosphorus layer is formed on an inner surface of a waveguide. Such a structure makes it possible to provide a transmission path with little loss, even when a signal at a frequency of over 8 GHz is transmitted.

The present invention is characterized in that in a transmission path transmitting high-frequency signals with each signal containing a frequency component of over 8 GHz, a nickel-phosphorus layer containing nickel and phosphorus, wherein a phosphorus concentration of the nickel-phosphorus layer is over 0 mass % and less than 8 mass %, and the transmission path forming at least a radiation element of an antenna device including: the radiation element transmitting/receiving the high-frequency signals; a ground conductor plate disposed adjacent to the radiation element; and a power feeding part feeding electric power to the radiation element or receiving electric power from the radiation element. Such a structure makes it possible to provide a transmission path with little loss, even when a signal at a frequency of over 8 GHz is transmitted.

BRIEF DESCRIPTION OF THE DRAWINGS

Best Modes for Carrying Out the Invention

Effect of the Invention

According to the present invention, it is possible to provide a transmission path with little loss even when a signal at a frequency of over 8 GHz is transmitted.

BRIEF DESCRIPTION OF DRAWINGS

Figure 1:
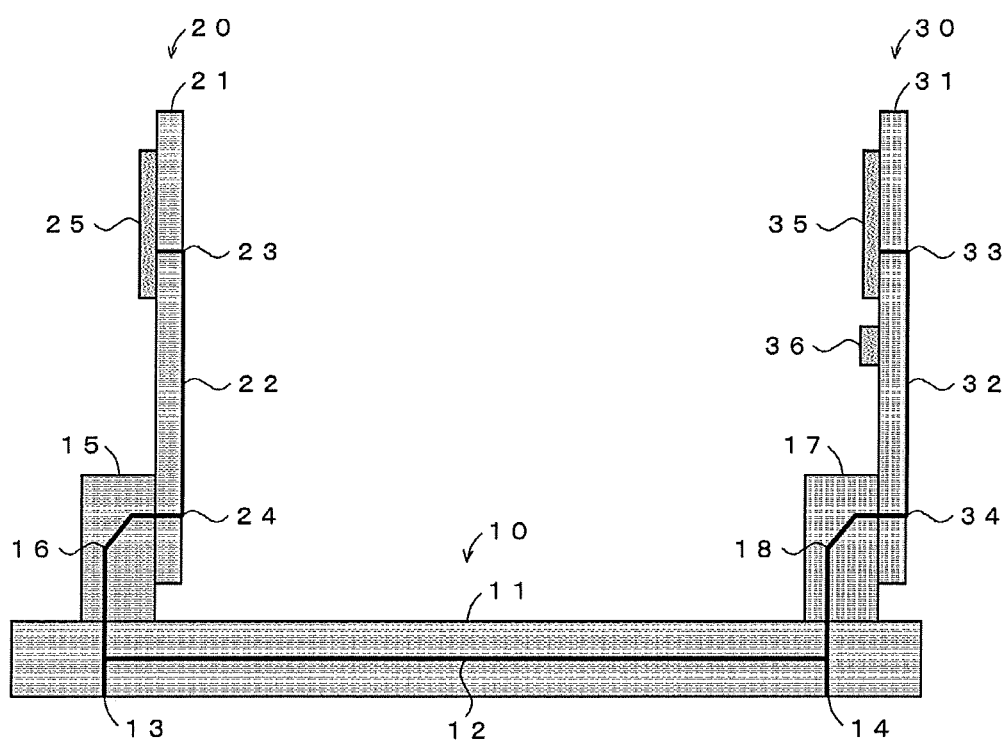

FIG. 1 is a view illustrating a configuration example according to a first embodiment of the present invention.

Figure 2:
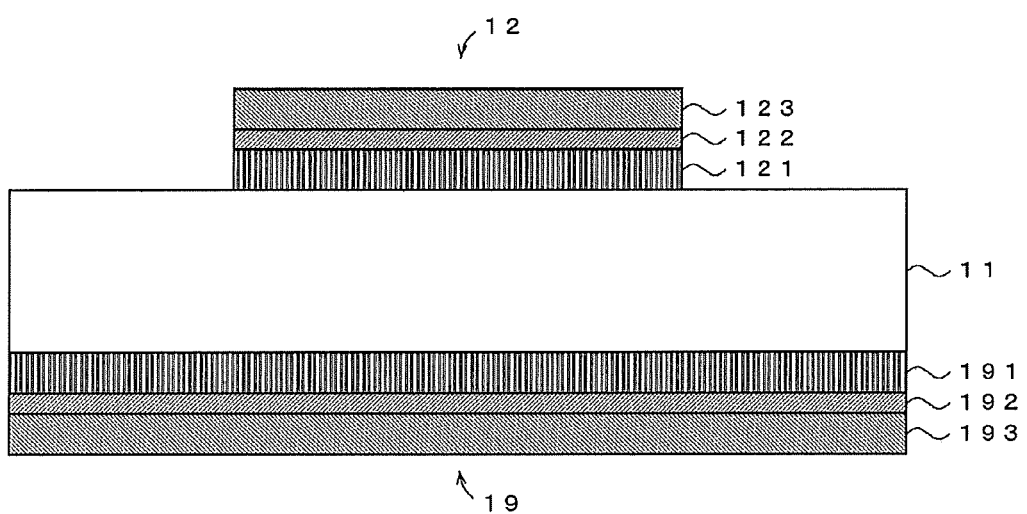

FIG. 2 is a sectional view illustrating a structural example of a transmission path illustrated in FIG. 1.

FIG. 3 is a view illustrating a relation among a phosphorus content concentration and a frequency, and a loss.

Figure 4:
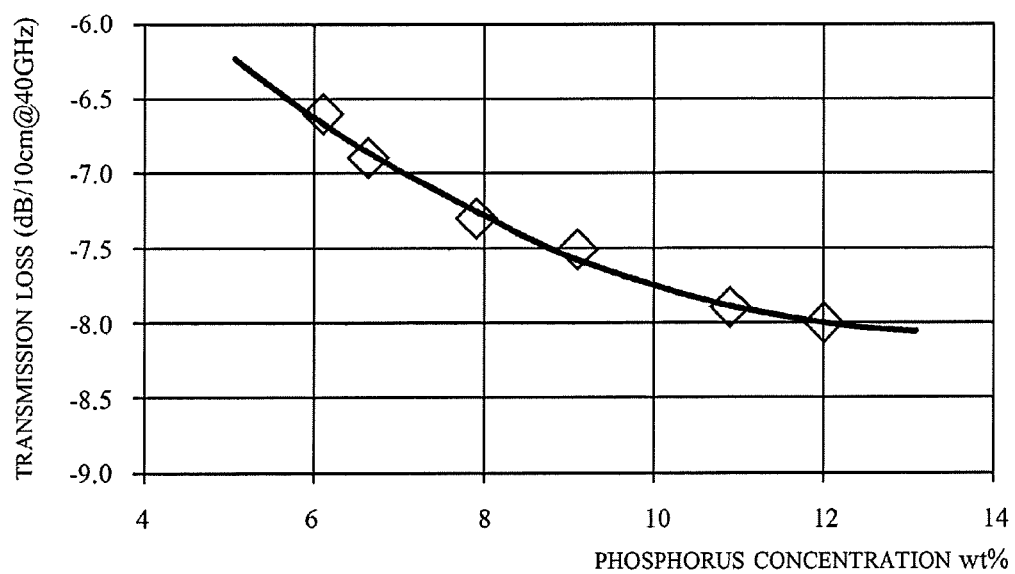

FIG. 4 is a view illustrating a relation between a phosphorus content concentration and a loss at 40 GHz.

FIG. 5 is a view illustrating a relation among a phosphorus content concentration and a transmission speed, and an eye-opening height.

Figure 6:
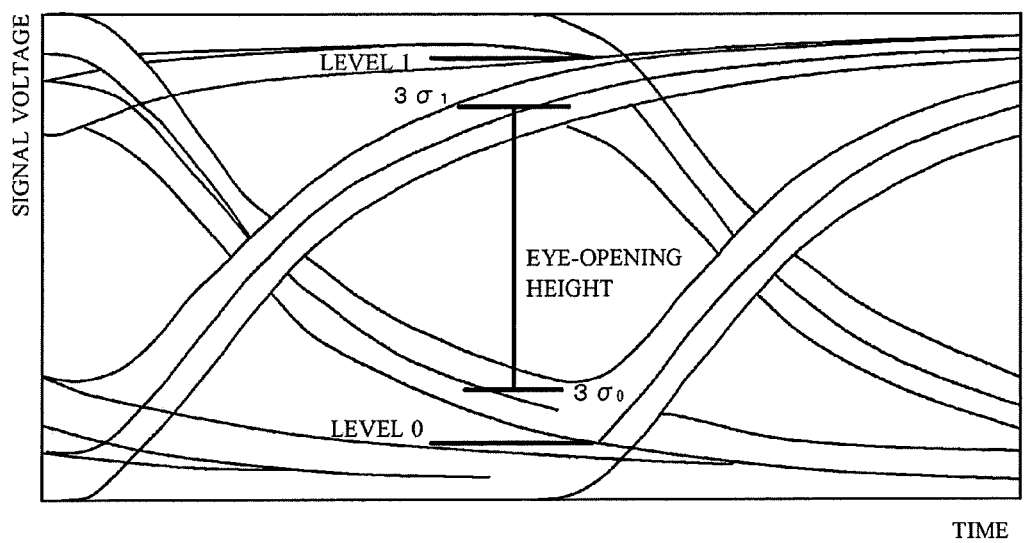

FIG. 6 is a view to explain the eye-opening height.

Figure 7:
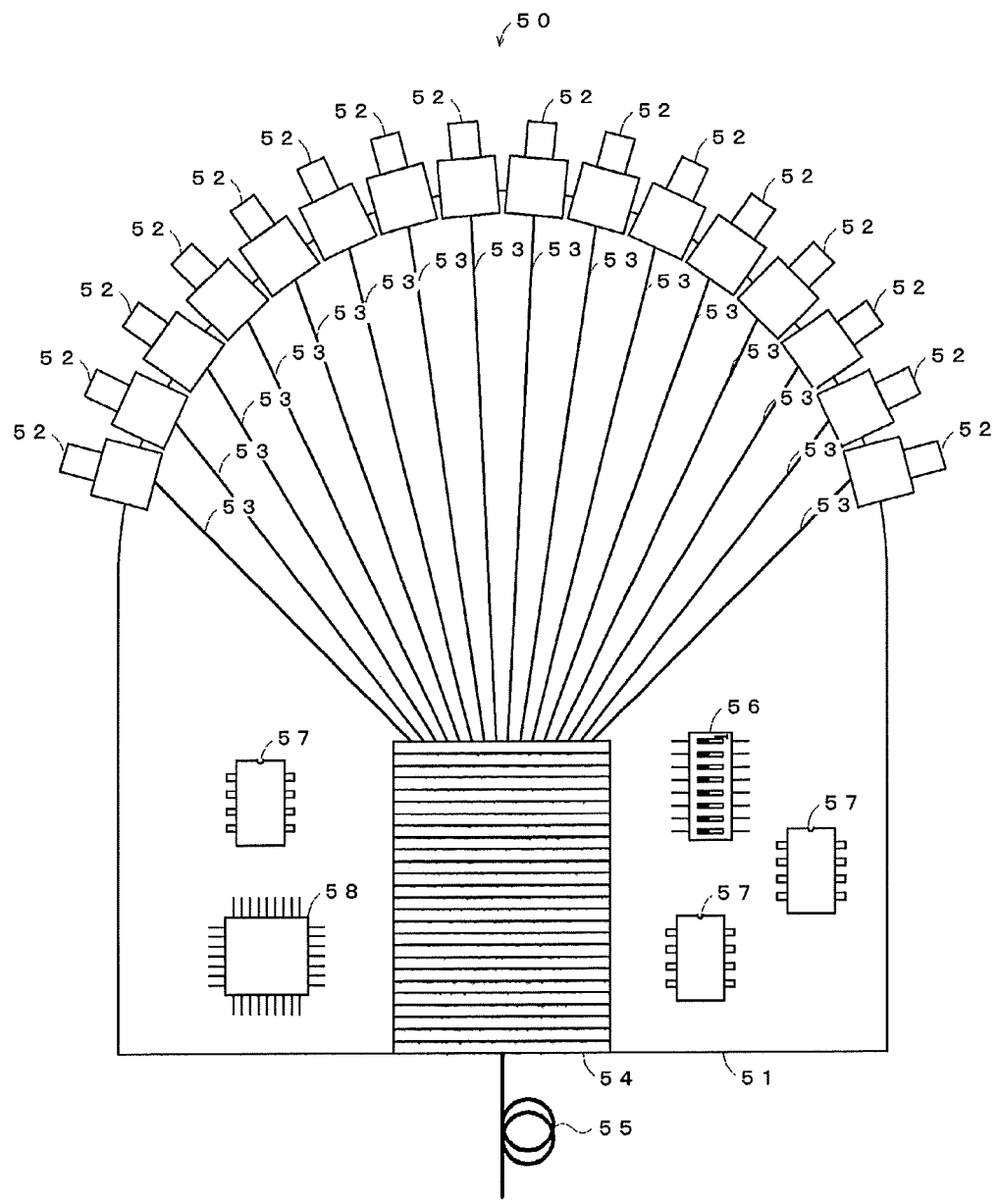

FIG. 7 is a view illustrating a configuration example according to a second embodiment of the present invention.

Figure 8:
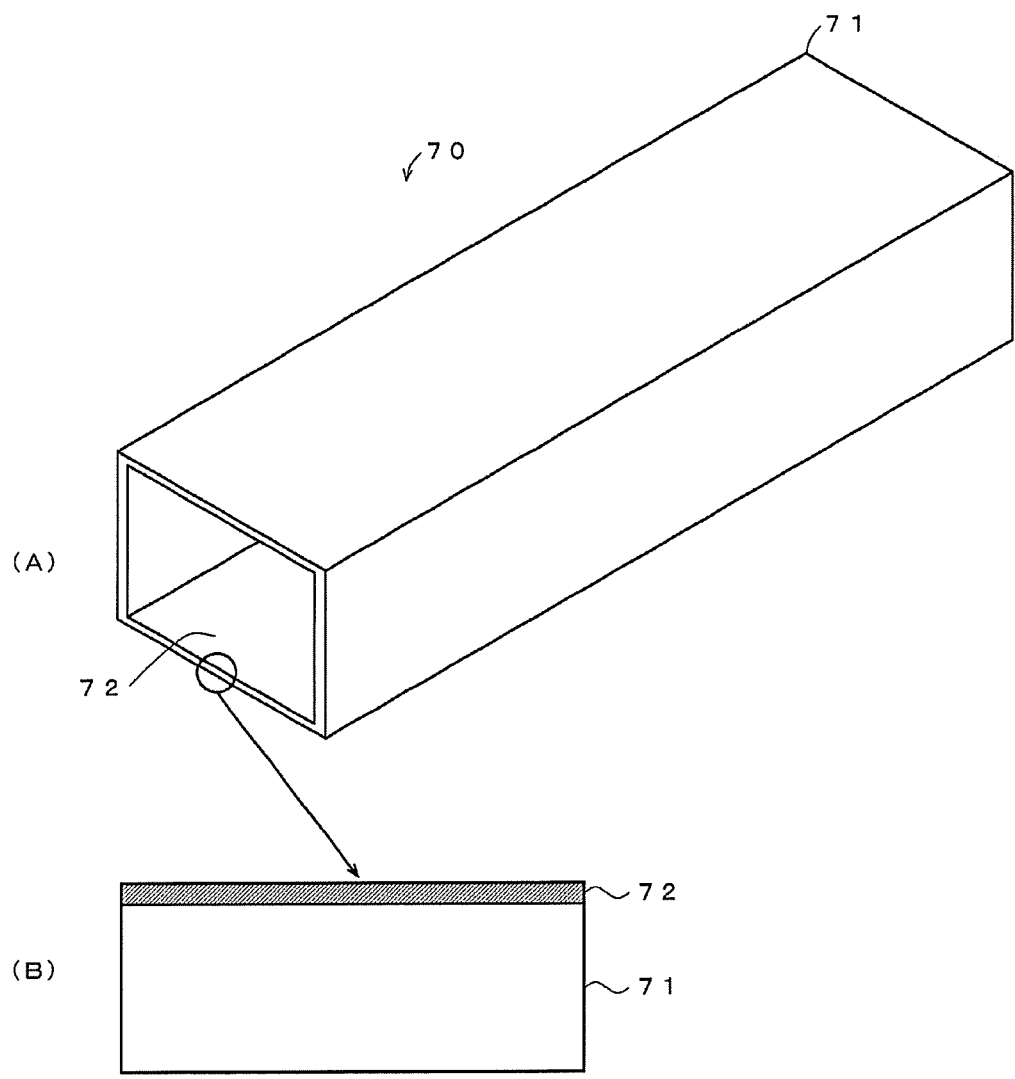

FIG. 8 are views each illustrating a structural example according to a modified embodiment of the present invention.

Figure 9:
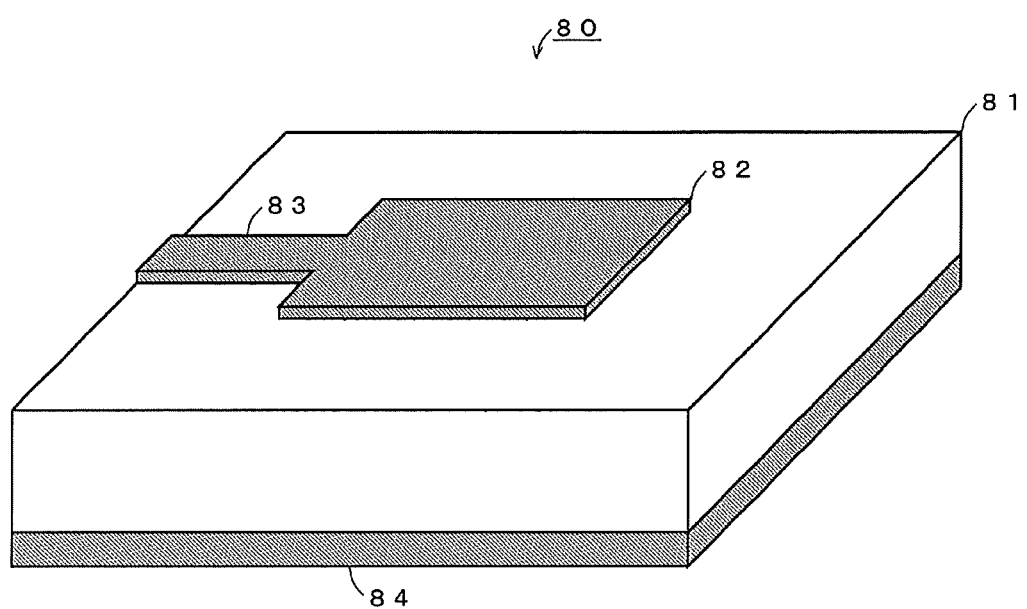

FIG. 9 is a view illustrating a structural example of an antenna device according to a third embodiment of the present invention.

Figure 10:
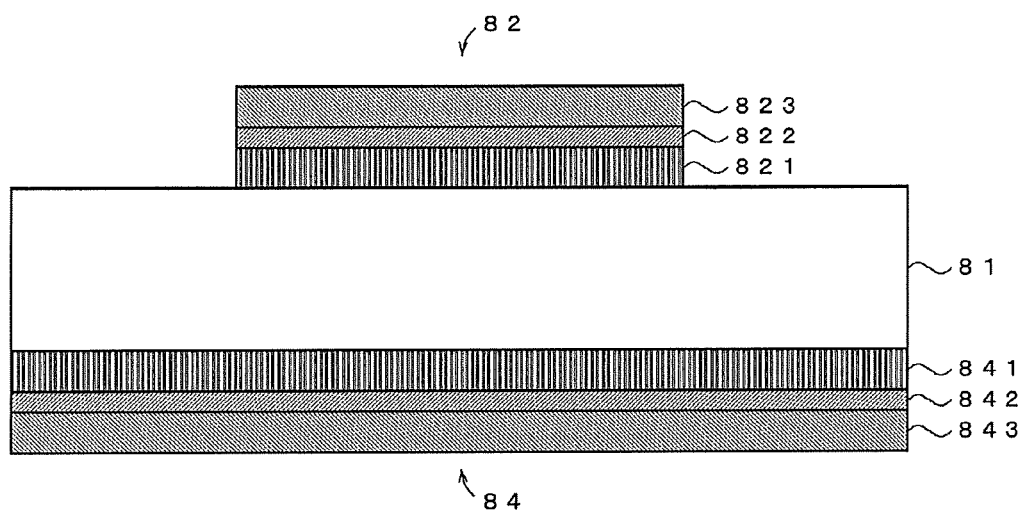

FIG. 10 is a sectional view illustrating a structure of a test sample used when a transmission loss is actually measured.

FIG. 11 is a view illustrating gain characteristics of the antenna device illustrated in FIG. 9.

Figure 12:
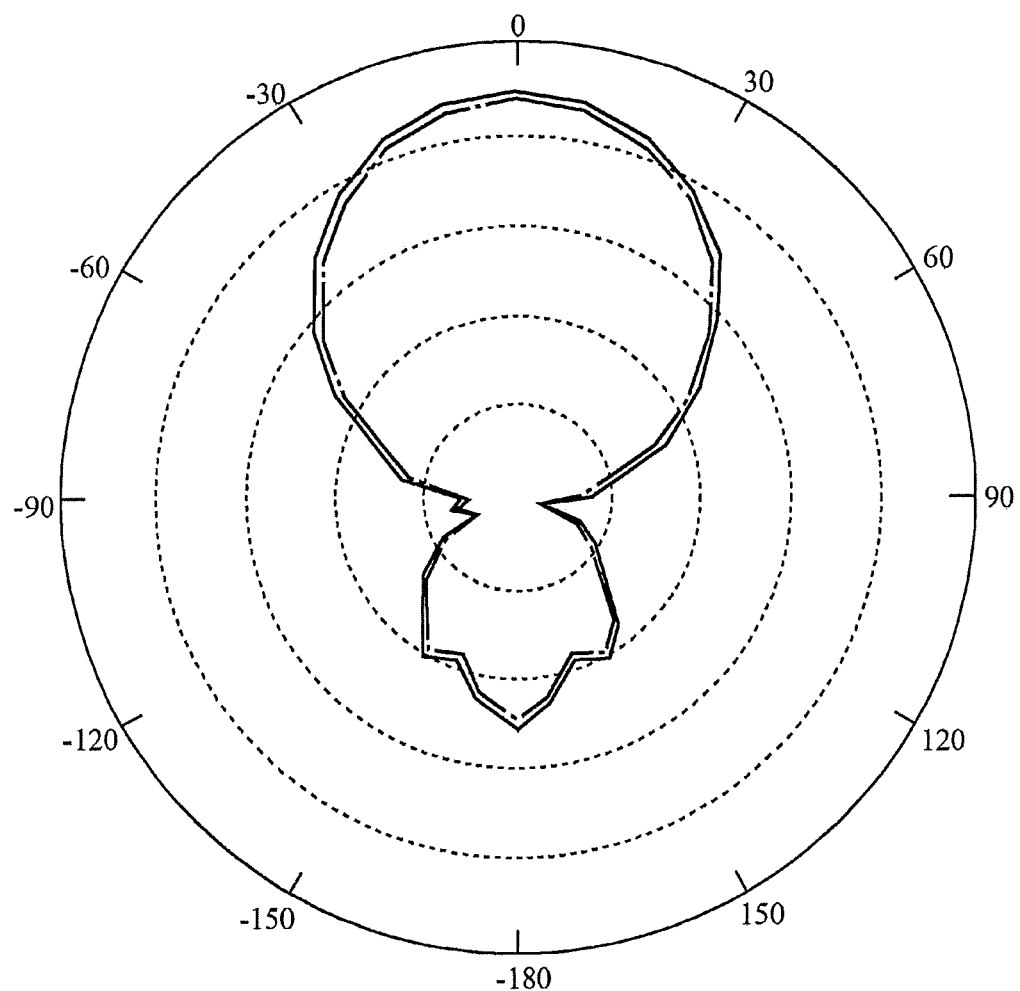

FIG. 12 is a view illustrating gain characteristics in all directions of the antenna device illustrated in FIG. 9.

Figure 13:
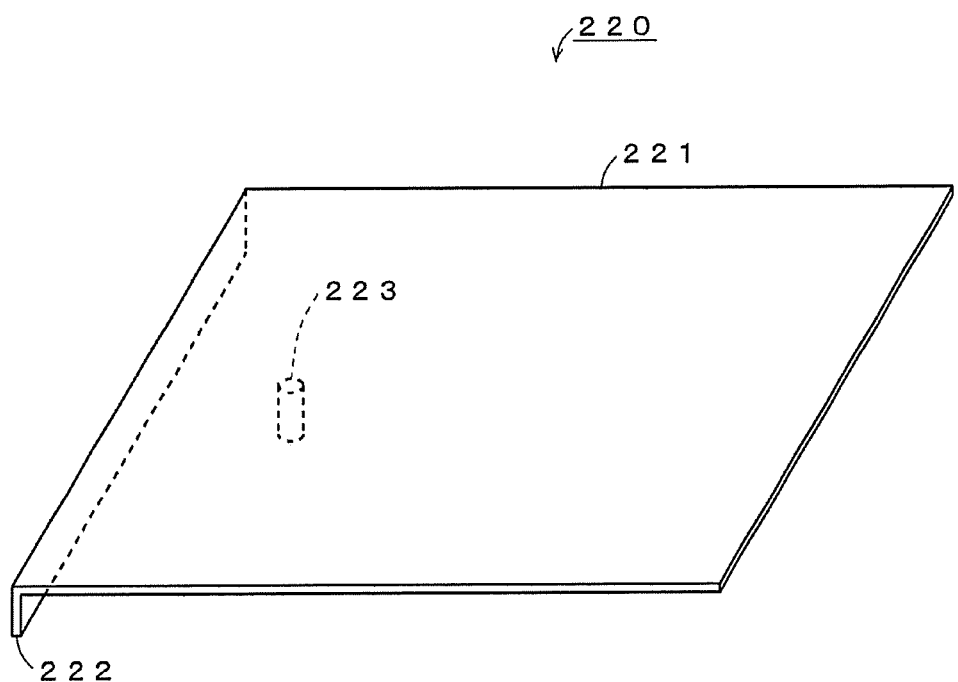

FIG. 13 is a view illustrating a structural example of an antenna device according to a fourth embodiment of the present invention.

Figure 14:
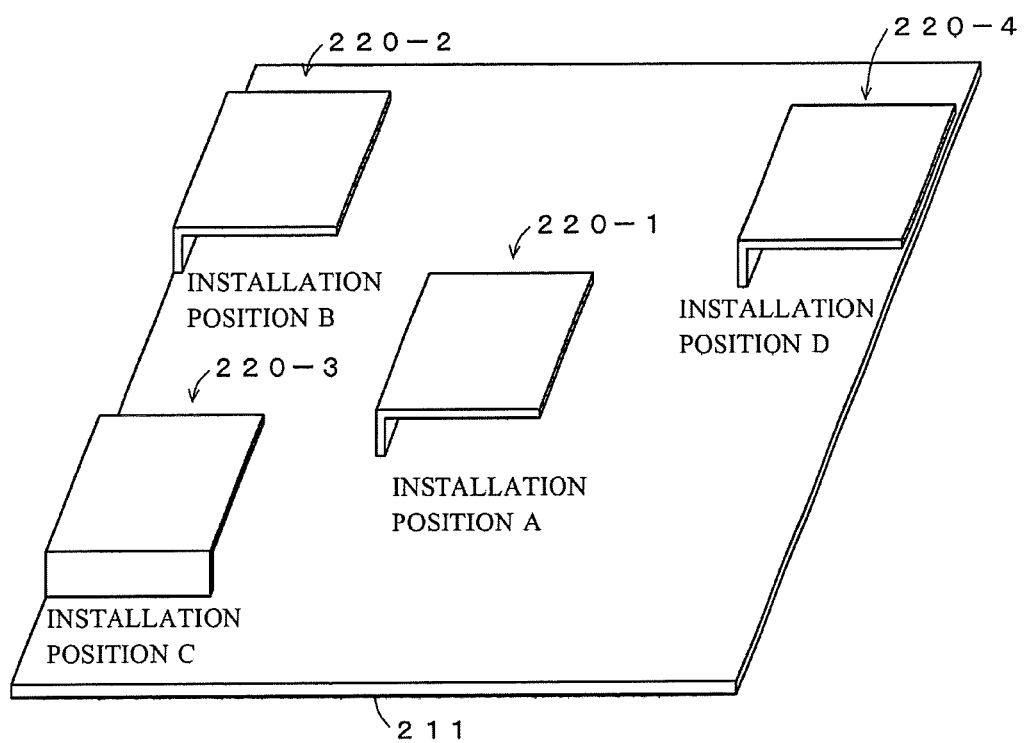

FIG. 14 is a view illustrating a disposition example of the antenna device illustrated in FIG. 13.

Figure 15:
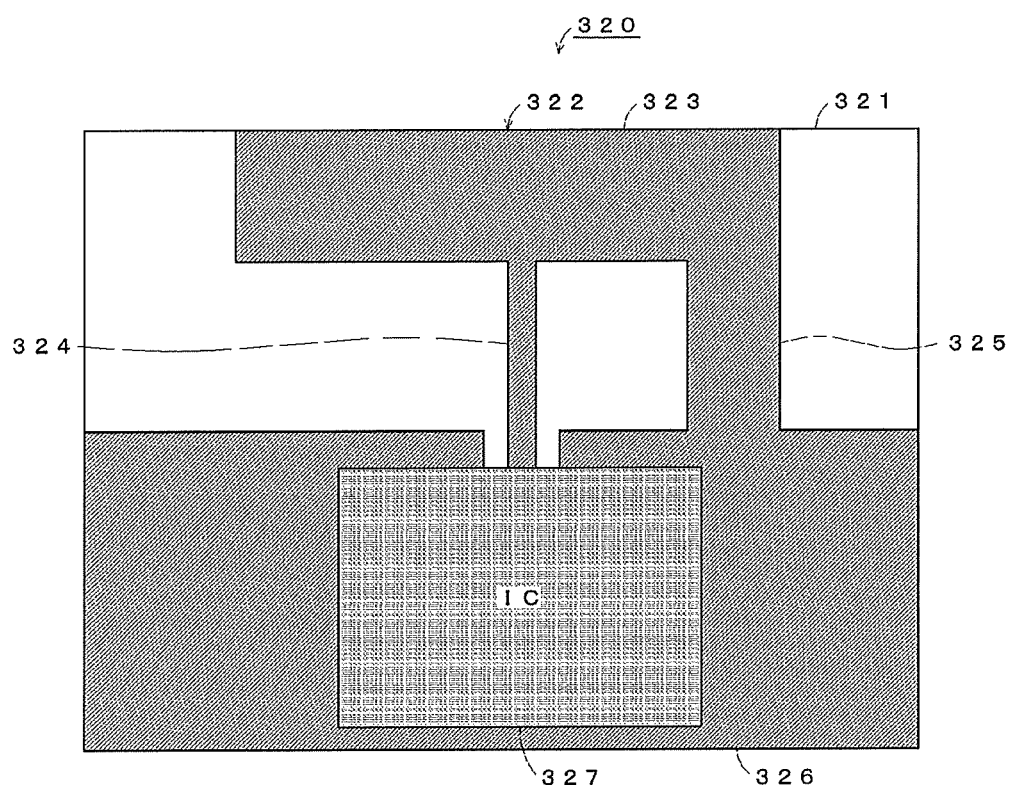

FIG. 15 is a view illustrating a structural example of an antenna device according to a fifth embodiment of the present invention.

Figure 16:
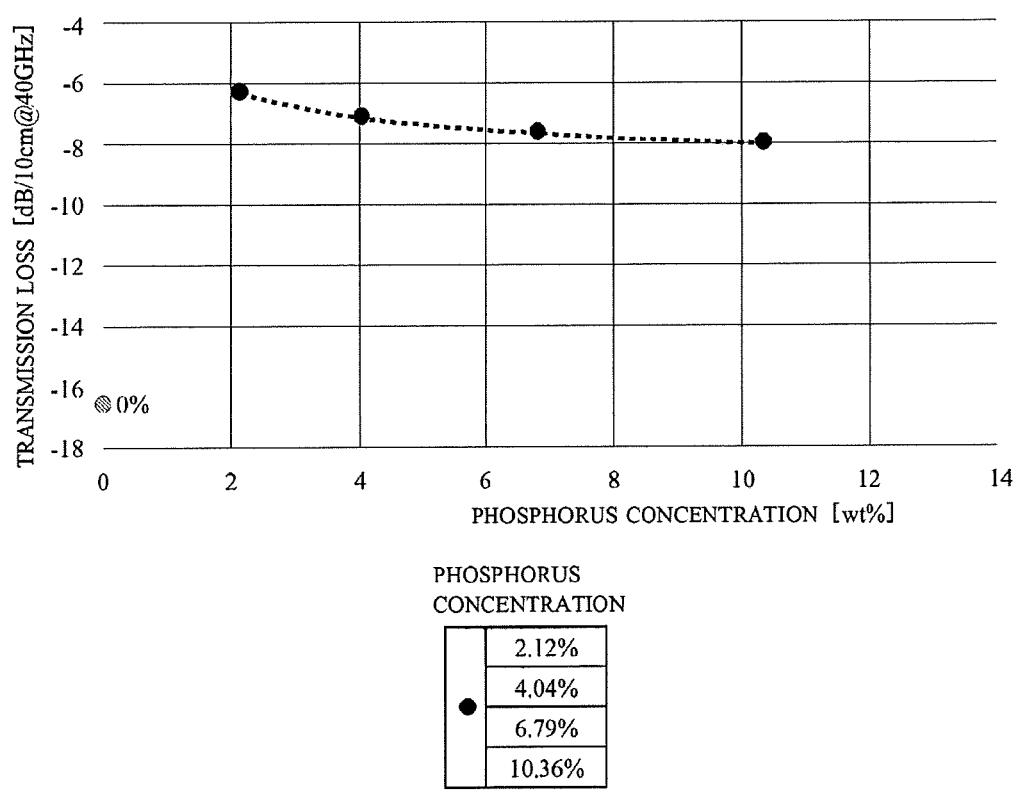

FIG. 16 is a view illustrating a transmission loss when a phosphorus concentration is decreased to 2.12 mass %.

FIG. 17 is a view illustrating a relation among a phosphorus content concentration and a frequency, and a loss when the phosphorus concentration is decreased to 2.12 mass %.

FIG. 18 is a view illustrating a relation among a phosphorus content concentration and a transmission speed, and an eye-opening height when the phosphorus concentration is decreased to 2.12 mass %.

FIG. 19 is a view illustrating gain characteristics of the antenna device illustrated in FIG. 9 when the phosphorus concentration is decreased to 2.12 mass %.

FIG. 20 is a view illustrating processes of plating treatment.

MODES FOR CARRYING OUT THE INVENTION

Next, embodiments of the present invention will be explained.

(A) Explanation of First Embodiment of Present Invention

FIG. 1 is a view illustrating a configuration example of a first embodiment of the present invention. The first embodiment illustrated in FIG. 1 illustrates a configuration of a part of a server used in, for example, a data center or the like. The first embodiment illustrated in FIG. 1 includes a backplane substrate 10 and unit substrates 20, 30. Here, the backplane substrate 10 includes a dielectric substrate 11, a transmission path 12, vias 13, 14, and connectors 15, 17.

Here, the dielectric substrate 11 is formed by a dielectric plate-like member. The transmission path 12 transmits digital signals between the connectors 15, 17. The vias 13, 14 penetrating through the dielectric substrate 11 are formed at both end parts of the transmission path 12. The connectors 15, 17 which respectively connect the unit substrates 20, 30 are disposed at an upper part (an upside in FIG. 1) of the dielectric substrate 11. Transmission paths 16, 18 which connect between transmission paths 22, 32 provided at insides of the unit substrates 20, 30 and the transmission path 12 provided at an inside of the backplane substrate 10 are respectively provided at insides of the connectors 15, 17.

The unit substrate 20 includes a dielectric substrate 21, where the transmission path 22 is provided, and vias 23, 24 penetrating through the dielectric substrate 21 are formed at both end parts of the transmission path 22. An IC (integrated circuit) chip 25 is mounted on the dielectric substrate 21, and a non-illustrated connection terminal of the IC chip 25 is connected to the transmission path 22 through the via 23. The transmission path 22 is connected to the transmission path 16 at the inside of the connector 15 through the via 24.

The unit substrate 30 includes a dielectric substrate 31, where the transmission path 32 is provided, and vias 33, 34 penetrating through the dielectric substrate 31 are formed at both end parts of the transmission path 32. An IC chip 35 and a circuit element 36 such as a capacitor are mounted on the dielectric substrate 31. A non-illustrated connection terminal of the IC chip 35 is connected to the transmission path 32 through the via 33. The transmission path 32 is connected to the transmission path 18 at the inside of the connector 17 through the via 34.

According to the configuration illustrated in FIG. 1, the unit substrate 20 operates as a transmission element, the unit substrate 30 operates as a reception element, and digital signals are transmitted from the unit substrate 20 toward the unit substrate 30 through the transmission paths 16, 12, 18. It goes without saying that a reverse operation may be performed.

In the first embodiment, the present invention is applied to the backplane substrate 10 and the transmission paths 22, 32 which are provided at the unit substrates 20, 30. That is, the transmission paths 22, 32 are formed by depositing a plurality of conductor layers on the dielectric substrates 21, 31. In more detail, a copper layer, a nickel-phosphorus layer, and a gold layer are deposited in a stacked state. A content ratio of phosphorus contained in the nickel-phosphorus layer is set to 6 mass % (hereinafter, "mass" is accordingly omitted and just denoted as "%") or more and less than 8 mass %, and it is thereby possible to reduce transmission loss with respect to a frequency of over 8 GHz.

FIG. 2 is a view illustrating a structural example of a test sample which was used when a loss of a transmission path according to the present invention was actually measured. The test sample illustrated in FIG. 2 has a structure as same as the transmission paths 22, 32 in FIG. 1. In an example in FIG. 2, the test sample is prepared by forming copper layers 121, 191 with each layer formed as a conductor layer by adhering a copper foil with a thickness of about 18 μm on each of both surfaces of the PTFE (poly tetra fluoro ethylene)-based dielectric substrate 11 with a thickness of about 0.13 mm, and subjecting the substrate to an etching process and a through-hole plating treatment. Next, nickel phosphorus plating is performed by means of electroless plating on surfaces of the copper layers 121, 191 to form nickel-phosphorus layers 122, 192 with each layer having a thickness of about 5 μm. At this time, a concentration of a plating solution is set such that a concentration of phosphorus of each of the nickel phosphorus layers 122, 192 becomes 6 mass % or more and less than 8 mass %. Next, gold layers 123, 193 with each layer having a thickness of about 50 nm are formed on surfaces of the nickel-phosphorus layers 122, 192 by means of gold plating. In FIG. 2, a transmission path 12 which is the same as the transmission path 22 or 32 in FIG. 1 is formed on an upper side surface of the dielectric substrate 11, and a ground layer 19 is formed on a lower side surface of the dielectric substrate 11.

FIG. 3 illustrates results of actual measurement of a transmission loss at each frequency when each phosphorus content concentration of the nickel-phosphorus layers 122, 192 was changed in the test sample illustrated in FIG. 2. In more detail, FIG. 3 is the results where the loss of the transmission path of the test sample in dB per 10 cm was actually measured while changing the phosphorus content concentration and the frequency.

The phosphorus concentration was measured by dissolving the nickel-phosphorus layer in a nitric acid solution, and subjecting the solution to mass spectrometry by using an inductively coupled plasma atomic emission spectroscopy (manufactured by Shimadzu Corporation, ICPS-7500 or the like), or mass spectrometry by EDS (energy dispersive X-ray spectrometry) analysis of a layer cross section, and the thickness of the nickel-phosphorus layer was measured by using a fluorescence X-ray film thickness meter (manufactured by Seiko Instruments Inc., SFT3200 or the like). Measurement of electric properties was performed by using a network analyzer as described later, and the properties of the sample were determined by measuring the transmission loss.

Here, the transmission loss indicates a ratio of transmittable signals without loss, reflection, and radiation in a sample transmission path by passing high-frequency signals through a test piece. It is determined that the smaller a value of the transmission loss is, the better the properties are.

As listed in FIG. 3, it became clear as a result of the actual measurement that when the phosphorus concentrations were 6.1, 6.6, 7.9 mass %, each loss became smaller compared to other concentrations at the frequency higher than 8 GHz. That is, when the frequency was 2 GHz, each loss became smaller when the phosphorus concentrations were 9.1, 10.9, 12.0% compared to the case when the phosphorus concentration was 6 to 8% (−1.0 dB to −0.9 dB became −0.7 dB). However, it became clear that when the frequency became higher, the loss did not change even when the phosphorus concentration changed at 8 GHz (the loss was constant to be −2.3 dB independent from the phosphorus concentration), and each loss became smaller when the phosphorus content concentration was 6 to 8% compared to the cases when the phosphorus content concentrations were 9.1, 10.9, 12.0% at 20 GHz or more (e.g., 20 GHz, 40 GHz, or 60 GHz in FIG. 3). As a relation between the transmission loss in dB at 40 GHz and the phosphorus concentration in Wt % illustrated in FIG. 4, it can be seen that the transmission loss becomes rapidly smaller when the concentration is below 8%.

It is possible to reduce the loss of the high-frequency signal by using the transmission paths each having the structure similar to FIG. 2 for the transmission paths 22, 32 illustrated in FIG. 1 and setting the phosphorus concentration of the nickel-phosphorus layer to 6 to 8%.

FIG. 5 illustrates simulation results of an eye-opening height when signals of 16, 28, 32, and 40 Gbaud were input at 1 Vpp (peak-to-peak voltage) to a transmission line having the structure similar to FIG. 2 with a length of 300 mm. Note that the eye opening height can be found from an average value at level 1, an average value at level "0" (zero) which are each calculated while complying with a standard of IEEE802.3 as illustrated in FIG. 6 in which an x-axis TIME and a y-axis SIGNAL VOLTAGE indicate a time and a voltage amplitude of a signal, 3 $\sigma_1$ (standard deviation noise at 3×level 1), and 3 $\sigma_0$ (standard deviation noise at 3×level 0) by using the following expression.

$$\text{Eye-opening height} = (\text{average value at level 1} - 3 \sigma_1) - (\text{average value at level 0} - 3 \sigma_0) \quad (1)$$

As listed in FIG. 5, results were obtained where the eye-opening heights improved at a transmission speed faster than 16 Gbaud (the transmission speed corresponding to the frequency of 8 GHz) when the phosphorus concentration was 6.1, 6.6, and 7.9% (hereinafter 6 to 8%), and an effect of the present invention could be verified. In more detail, in the case of 16 Gbaud, the eye-opening heights were the same to be 0.6 when the phosphorus content concentrations were 6 to 8% and 12%. However, as the transmission speed became faster, for example, in the case of 28 Gbaud (the transmission speed corresponding to the frequency of 14 GHz), each eye-opening height was 0.5 when the phosphorus content concentration was 6 to 8%, and the eye-opening height was 0.4 when the phosphorus content concentration was 12%. In the case of 32 Gbaud (the transmission speed corresponding to the frequency of 16 GHz), each eye-opening height was 0.4 to 0.5 when the phosphorus content concentration was 6 to 8%, where the eye-opening height was 0.3 when the phosphorus content concentration was 12%. Further, in the case of 40 Gbaud (the transmission speed corresponding to the frequency of 20 GHz), each eye-opening height was 0.3 when the phosphorus content concentration was 6 to 8%, where the eye-opening height was 0.2 when the phosphorus content concentration was 12%.

As described hereinabove, according to the first embodiment of the present invention, it is possible to reduce the loss and increase the eye-opening height by using the transmission path having the stacked structure illustrated in FIG. 2 for the transmission paths 22, 32 transmitting the digital signals and setting the phosphorus content concentration of the nickel-phosphorus layer to 6 to 8 mass %. As a result, it is possible to reduce occurrence of transmission errors.

(B) Explanation of Second Embodiment of Present Invention

FIG. 7 is a view illustrating a configuration example of a second embodiment of the present invention. The second embodiment illustrated in FIG. 7 is an example where the present invention is applied to an optical/electrical converter which is used in optical communication or the like. An optical/electrical converter 50 illustrated in FIG. 7 includes a dielectric substrate 51, connectors 52, transmission paths 53, an optical/electrical converting part 54, an optical fiber 55, and electronic components 56, 57 and 58.

Here, the dielectric substrate 51 is formed of, for example, an insulator such as PTFE. Sixteen connectors 52 are disposed at an end part of the dielectric substrate 51 formed in a semicircular pattern, and non-illustrated coaxial cables are respectively connected thereto. Each transmission path 53 has a structure similar to FIG. 2, and connects between the connectors 52 and the optical/electrical converting part 54. The optical/electrical converting part 54 multiplexes signals input from the transmission paths 53, then converts electrical signal into optical signals to transfer to the optical fiber 55, and converts optical signals input from the optical fiber 55 into electrical signals, then demultiplexes to supply to each of the connectors 52 through the transmission paths 53.

In the second embodiment illustrated in FIG. 7, each of the transmission paths 53 has a structure similar to FIG. 2, and a phosphorus concentration of the nickel-phosphorus layer is set to 6 to 8 mass %. Signals of over 8 GHz (16 Gbaud) are transmitted through each of the transmission paths 53. Accordingly, the signal which is transmitted through the transmission path 53 has little loss as illustrated in FIG. 3, and the eye-opening height is kept to be high as illustrated in FIG. 6. According to the second embodiment illustrated in FIG. 7, it is possible to reduce occurrence of transmission errors between the connectors 52 and the optical/electrical converting part 54.

(C) Explanation of Third Embodiment of Present Invention

FIG. 9 is a view illustrating a structural example of an antenna device according to a third embodiment of the present invention. In the third embodiment illustrated in FIG. 9, an antenna device 80 includes a dielectric substrate 81, a radiation element 82, a power feeding line 83, and a ground conductor plate 84.

Here, the dielectric substrate 81 is formed by a dielectric plate-like member, and electrically insulates the radiation element 82 and the power feeding line 83, and the ground conductor plate 84.

The radiation element 82 is formed by stacking a plurality of conductors as it is described later with reference to FIG. 10, and is a patch antenna which radiates high-frequency signals supplied from the power feeding line 83 as radio waves.

The power feeding line 83 supplies the high-frequency signals such as millimeter waves and microwaves to the radiation element 82.

In the third embodiment, the present invention is applied to the radiation element 82, the power feeding line 83, and the ground conductor plate 84. That is, the radiation element 82, the power feeding line 83, and the ground conductor plate 84 are each formed by depositing a plurality of conductor layers on the dielectric substrate 81. In more detail, a copper layer, a nickel-phosphorus layer, and a gold layer are deposited in a stacked state. A phosphorus content ratio contained in the nickel-phosphorus layer is set to 6 mass % or more and less than 8 mass %, and gain can be thereby improved with respect to a frequency of over 8 GHz.

FIG. 10 is a view illustrating a structural example of a test sample which was used when a loss was actually measured in a case when high-frequency signals were transmitted to the radiation element 82 used for the antenna device 80 of the present invention as illustrated in FIG. 9. The test sample illustrated in FIG. 10 has a structure which is the same as the radiation element 82 and the ground conductor plate 84 in FIG. 9 which is the same as the ground conductor plate 84 in FIG. 10. In an example in FIG. 10, the test sample is prepared by forming copper layers 821, 841 as conductor layers on the PTFE (poly tetra fluoro ethylene)-based dielectric substrate 81 with a thickness of about 0.13 mm by adhering a copper foil with a thickness of about 18 μm on each of both surfaces of the substrate, and subjecting the substrate to an etching process and a through-hole plating treatment. Next, nickel-phosphorus plating is performed by means of electroless plating on surfaces of the copper layers 821, 841 to form nickel-phosphorus layers 822, 842 with each layer having a thickness of about 5 μm. At this time, a concentration of a plating solution is set such that a concentration of phosphorus of each of the nickel-phosphorus layers 822, 842 becomes 6 mass % or more and less than 8 mass %. Next, gold layers 823, 843 with each layer having a thickness of about 50 nm are formed on surfaces of the nickel-phosphorus layers 822, 842 by means of gold plating.

In the sample illustrated in FIG. 10, results where a transmission loss was measured at each frequency when phosphorus content concentrations of the nickel-phosphorus layers 822, 842 were changed are listed in FIG. 3. In more detail, FIG. 3 is the results of actual measurement where the losses of the transmission path of the test sample illustrated in FIG. 10 per 10 cm while changing the phosphorus content concentration and the frequency.

The phosphorus concentration was measured by dissolving the nickel-phosphorus layer in a nitric acid solution, and subjecting the solution to mass spectrometry by using an inductively coupled plasma atomic emission spectroscopy (manufactured by Shimadzu Corporation, ICPS-7500 or the like), or mass spectrometry by EDS (energy dispersive X-ray spectrometry) analysis of a layer cross section, and the thickness of the nickel-phosphorus layer was measured by using a fluorescence X-ray film thickness meter (manufactured by Seiko Instruments Inc., SFT3200 or the like). Measurement of electric properties was performed by using a network analyzer as described later, and the properties of the sample were judged by measuring transmission loss.

Here, the transmission loss indicates a ratio of transmittable high-frequency signals without loss, reflection, and radiation in a sample transmission path by passing the high-frequency signals through a test piece. It is judged that the smaller a value of the transmission loss is, the better the properties are. Later-described graphs and tables are represented by values in minus, and in this case, the properties are judged to be good as the values are larger.

As listed in FIG. 3, it became clear as a result of the actual measurement that when the phosphorus concentrations were 6.1, 6.6, 7.9 mass %, each loss became smaller compared to other concentrations at the frequency higher than 8 GHz. That is, when the frequency was 2 GHz, the losses became smaller when the phosphorus concentrations were 9.1, 10.9, 12.0% compared to the case when it was 6 to 8% (−1.0 dB to −0.9 dB became −0.7 dB). However, it became clear that when the frequency became higher, the loss did not change even when the phosphorus concentration changed when the frequency was 8 GHz (the loss was constant to be −2.3 dB independent from the phosphorus concentration), and the loss became smaller when the phosphorus content concentration was 6 to 8% compared to the cases when the phosphorus content concentrations were 9.1, 10.9, 12.0% when the frequency was 20 GHz or more. As a relation between the transmission loss in dB per 10 cm at 40 GHz and the phosphorus concentration in Wt % is illustrated in FIG. 4, it can be seen that the transmission loss becomes rapidly smaller when the concentration is below 8%.

It is possible to improve the gain of the antenna device which radiates electromagnetic waves from the radiation element 82 by applying the structure similar to FIG. 10 to the radiation element 82, the power feeding line 83, and the ground conductor plate 84 illustrated in FIG. 9 and setting the phosphorus concentration of the nickel-phosphorus layer to 6.1, 6.6, and 7.9% (hereinafter 6 to 8%).

FIG. 11 lists antenna gains in dB at 48 GHz when the phosphorus content concentration of the antenna device 80 having the structure similar to FIG. 10 was changed. Note that the antenna gain is an index value representing energy intensity at a radiation angle where radiation becomes the maximum, and efficiency is higher as the value is larger. As listed in FIG. 11, when the phosphorus content concentration were 6.1%, 6.6%, 7.9%, 12.0%, the gains were 26.4 dBi, 26.3 dBi, 26.1 dBi, and 25.8 dBi.

FIG. 12 illustrates antenna gain characteristics in all directions of the antenna device 80 as illustrated in FIG. 9 when the phosphorus content concentration is changed. In FIG. 12, a solid line represents characteristics when the phosphorus content concentration is 6 to 8 mass %, and a dot-and-dash line represents characteristics when the phosphorus content concentration is 12 mass %. As illustrated in FIG. 12, when the phosphorus content concentration is 6 to 8 mass %, the gain improves in all directions compared to the case when it is 12 mass %.

As described above, in the third embodiment of the present invention, it is possible to improve the antenna gain for about 0.5 dBi by using the stacked structure illustrated in FIG. 10 as each of the radiation element 82 and the ground conductor plate 84 of the antenna device 80 as illustrated in FIG. 9, and setting the phosphorus content concentration of the nickel-phosphorus layer to 6 to 8 mass %. As a result, the antenna gain can be improved for about 1 dBi by using the present invention for both a transmitting antenna and a receiving antenna.

(D) Explanation of Fourth Embodiment of Present Invention

FIG. 13 is a view illustrating a structural example of an antenna device according to a fourth embodiment of the present invention. The fourth embodiment illustrated in FIG. 13 is formed as a plate-like inverse F antenna device 220. The plate-like inverse F antenna device 220 includes a radiation element 221, a short-circuit part 222, and a power feeding part 223.

Here, the plate-like inverse F antenna device 220 is formed by bending an end part of a conductor having the stacked structure illustrated in FIG. 10. That is, the radiation element 221 and the short-circuit part 222 can be formed by bending an end part of the plate-like member including the copper layer 821, the nickel-phosphorus layer 822, and the gold layer 823 illustrated in FIG. 10 almost at a right angle. The power feeding part 223 can be formed by connecting a columnar conductor to a part of the radiation element 221.

FIG. 14 illustrates a disposition example of the plate-like inverse F antenna device 220 illustrated in FIG. 13 on a ground conductor plate 211. In this example, four plate-like inverse F antenna devices 220-1, 220-2, 220-3, and 220-4 are disposed on four installation positions A, B, C, and D, respectively. The ground conductor plate 211 is formed by stacking the copper layer, the nickel-phosphorus layer, and the gold layer as illustrated in FIG. 10.

The plate-like inverse F antenna device 220 is formed by making a part of a linear inverse F antenna device in parallel to a ground plate into a plate-like shape. Here, the linear inverse F antenna device is an antenna where a monopole antenna being a basis of an antenna is bent at a right angle, and impedance characteristics are improved by adding a short-circuit line in a vicinity of a power feeding line, and it is named after its F shape. The plate-like inverse F antenna device 220, where the linear inverse F antenna device as stated above is improved, is an antenna where a part of the linear inverse F antenna which is in parallel to the ground conductor plate is made into a plate-like shape, and various modifications become possible and flexibility of the antenna increases such that power feeding lines can be located at various positions, a slot (cut) can be formed at the radiation element due to its plate-like shape. Note that a bandwidth of the plate-like inverse F antenna device 220 can be increased to 10 times or more as much as a plate-like inverse antenna device having a basic shape by adding a chip resistance element to the short-circuit part 222 to make an antenna length to λ/8 and reducing an antenna height to 0.01λ.

According to the plate-like inverse F antenna device 220 illustrated in FIG. 13 and FIG. 14, the antenna gain can be improved using similar methods as used in the first embodiment by using the stacked structure illustrated in FIG. 10 for at least one of the radiation element 221, the short-circuit part 222, the power feeding part 223 as illustrated in FIG. 13, and the ground conductor plate 211 as illustrated in FIG. 14, and setting the phosphorus content concentration of the nickel-phosphorus layer to 6 to 8 mass %. The gain can be further improved by applying the present invention to both of a transmitting antenna and a receiving antenna.

(E) Explanation of Fifth Embodiment of Present Invention

FIG. 15 is a view illustrating a structural example of an antenna device according to a fifth embodiment of the present invention. The fifth embodiment illustrated in FIG. 15 is formed as an inverse F antenna device 320. In the inverse F antenna device 320, a stacked conductor layer 322 having the stacked structure similar to FIG. 10 is formed on a dielectric substrate 321, and an IC (integrated circuit) 327 is mounted thereon.

Here, the stacked conductor layer 322 includes a radiation element 323 having a rectangular form, a power feeding part 324 feeding high-frequency power from the IC 327 to the radiation element 323, a short-circuit part 325 short-circuiting the radiation element 323 to a ground conductor 326, and the ground conductor 326 is kept at a ground potential.

The IC 327 is mounted on the ground conductor 326, and feeds the high-frequency power to the radiation element 323 through the power feeding part 324.

In the structural example illustrated in FIG. 15, all of the radiation element 323, the power feeding part 324, the short-circuit part 325, and the ground conductor 326 are each set to have the stacked structure illustrated in FIG. 10, but at least one of the above features may have the stacked structure illustrated in FIG. 10.

According to the F antenna device 320 illustrated in FIG. 15, the antenna gain can be improved using similar methods as used in the first embodiment by using the stacked structure illustrated in FIG. 10 for at least one of the radiation element 323, the power feeding part 324, the short-circuit part 325, and the ground conductor 326, and setting the phosphorus content concentration of the nickel-phosphorus layer to 6 to 8 mass %. The gain can be further improved by applying the inverse F antenna device 320 illustrated in FIG. 15 being the present invention to both of a transmitting antenna and a receiving antenna.

(F) Explanation of Modified Embodiment

It goes without saying that the above-mentioned embodiments are just examples, and the present invention is not limited to the above cases. In each of the embodiments, the phosphorus content concentration of the nickel-phosphorus layer was set in a range of 6 to 8 mass %, but it may be set to be the range or less.

FIG. 16 illustrates results where transmission losses (dB) of a transmission path at 40 GHz per 10 cm were measured while changing the phosphorus content concentration in wt % of the nickel-phosphorus layer. As illustrated by black circles in FIG. 16, the transmission loss decreases as the phosphorus concentration decreases from 10.36% to 2.12%. In more detail, in an example in FIG. 16, the transmission loss does not largely change even if the phosphorus concentration decreases from 10.36% to about 8% as illustrated by a dotted line. However, the decrease in the transmission loss becomes obvious when the phosphorus concentration becomes less than 8% (e.g., 6.79%, 4.04%), and becomes the minimum when the phosphorus concentration is 2.12%. Meanwhile, the transmission loss becomes 16 dB or more when the phosphorus concentration becomes 0% as illustrated by a hatched circle at a left end in FIG. 16.

FIG. 17 lists results where the transmission losses in dB per 10 cm were measured until the phosphorus concentration became 0% through the method as same as FIG. 3. As listed in FIG. 17, it became clear as a result of the actual measurement that when the phosphorus concentrations were 2.12, 4.04, 6.79 mass %, each loss became smaller compared to a case of 10.36 mass % at the frequency higher than 8 GHz. That is, when the frequency was 2 GHz, the loss became smaller (i.e. −0.6 dB) when the phosphorus concentration was 10.36% as compared to the cases of −2.12, 4.04, 6.79% (i.e. −1.3 dB, −1.7 db, −0.7 dB). However, when the frequency became higher, the loss became constant even when the phosphorus concentration changed at 8 GHz except when the phosphorus concentration was 0.0 mass % (i.e. −3.4 dB at 2 GHz), and the losses became smaller when the phosphorus content concentrations were 2.12 to 6.79% as compared to the case of 10.36% at 20 GHz or more. When the phosphorus concentration was 0.0 mass %, the loss became larger compared to the case of 2.12 mass % or more. For example, the transmission losses in dB per 10 cm at 8 GHz were −7.9 dB, −2.3 dB, −2.3 dB, −2.3 dB, and −2.3 dB when the phosphorus content concentrations were 0.0, 2.12, 4.04, 6.79, and 10.36 mass %, respectively; the transmission losses in dB per 10 cm at 20 GHz were −11.3 dB, −3.8 dB, −4.4 dB, −4.8 dB, and −4.9 dB when the phosphorus content concentrations were 0.0, 2.12, 4.04, 6.79, and 10.36 mass %, respectively; the transmission losses in dB per 10 cm at 40 GHz were −16.7 dB, −6.3 dB, −7.1 dB, −7.6 dB, and −7.9 dB when the phosphorus content concentrations were 0.0, 2.12, 4.04, 6.79, and 10.36 mass %, respectively. and the transmission losses in dB per 10 cm at 60 GHz were −21.9 dB, −8.4 dB, −9.4 dB, −9.9 dB, and −10.3 dB when the phosphorus content concentrations were 0.0, 2.12, 4.04, 6.79, and 10.36 mass %, respectively.

FIG. 18 is a view corresponding to FIG. 5. As listed in FIG. 18, results were obtained where eye-opening heights improved at a transmission speed faster than 16 Gbaud (the transmission speed corresponding to the frequency of 8 GHz) when the phosphorus concentration was 2.12, 4.04, 6.79, and 10.36%. In more detail, in the case of 16 Gbaud, each eye-opening height was 0.6 when the phosphorus content concentration was 2.12 to 10.36%. However, as the transmission speed became faster, for example, in the case of 28 Gbaud (the transmission speed corresponding to the frequency of 14 GHz), the eye-opening height was 0.6 when the phosphorus content concentration was 2.12%, each eye-opening height was 0.5 when the phosphorus content concentrations were 4.04, 6.79%, and the eye-opening height was 0.4 when the phosphorus content concentration was 10.36%. In the case of 32 Gbaud (the transmission speed corresponding to the frequency of 16 GHz), the eye-opening height was 0.6 when the phosphorus content concentration was 2.12%, each eye-opening height was 0.4 when the phosphorus content concentrations were 4.04, 6.79%, and the eye-opening height was 0.3 when the phosphorus content concentration was 10.36%. Further, in the case of 40 Gbaud (the transmission speed corresponding to the frequency of 20 GHz), each eye-opening height was 0.4 when the phosphorus content concentrations were 2.12, 4.04%, the eye-opening height was 0.3 when the phosphorus content concentration was 6.79%, and the eye-opening height was 0.2 when the phosphorus content concentration was 10.36%. When the phosphorus concentration was 0.0 mass %, the eye-opening height became lower compared to the case when the phosphorus concentration was 2.12 mass % or more. For example, when the phosphorus concentration was 0.0 mass %, the eye-opening heights were 0.3, 0.2, 0.2, and 0.1 for the transmission speeds of 16 Gbaud, 28 Gbaud, 32 Gbaud, and 40 Gbaud, respectively.

FIG. 19 is a view corresponding to FIG. 11, and lists antenna gains in dBi at 48 GHz when the phosphorus content concentration of the antenna device 80 having the structure similar to FIG. 10 was changed. As listed in FIG. 19, the gains were 18.5, 27.3, 26.7, 26.3, and 25.9 dBi when the phosphorus content concentration were 0.0, 2.12, 4.04, 6.79, and 10.36 mass %. Accordingly, the gain improved 1.4 dBi when the phosphorus content concentration was changed from 2.12 mass % to a case of 10.36 mass % (e.g., from 27.3 to 25.9), the gain improved 0.8 dBi when the phosphorus content concentration was changed from 4.04 mass % to a case of 10.36 mass % (e.g., from 26.7 to 25.9 dBi), and the gain improved 0.4 dBi when the phosphorus content concentration was 6.79 mass % compared to the case of 10.36 mass %. When the phosphorus concentration was 0.0 mass %, the antenna gain was lowered compared to the case of 2.12 mass % (e.g., from 26.3 to 25.9 dBi)

An optimum value is considered to be in a range of over 0 mass % and 3 mass % or less from comparisons of FIG. 16 to FIG. 19. Regarding a lower limit value of the optimum value, it turns out that characteristics are improved compared to the case of 0 mass % when the lower limit value is 0.5 mass % or more, or 1.0 mass % or more from a simple experimentation up to now, further, when the lower limit value is 1.0 mass % or more, it is preferable because the phosphorus concentration at a plating time can be more easily controlled. When the lower limit value is 2.0 mass % or more, it is further preferable because the phosphorus concentration at the plating time can be more easily controlled, but it may be below 2.0 mass %. Further, it is known that an upper limit value of the optimum value is preferably 6 mass % or less, more preferably 4 mass % or less, and further preferably 3 mass % or less. In addition, solder wettability (for example, reliability of bonding with a solder) of the nickel-phosphorus layer can be improved by setting the value in a range satisfying the above, and more suitable characteristics as the transmission path can be obtained.

FIG. 20 is a view illustrating processes of plating treatment. As listed in FIG. 20, in the following order, the indicated processes of the plating treatment include, (1) in an immersion degreasing process, immersing in a degreasing liquid (for example, a chemical liquid with a product name: ICP Clean SC at a concentration of 150 ml/L at a temperature of 40° C.) for a time of four minutes, (2) in an acid degreasing liquid process, immersing in an acid degreasing liquid (for example, a chemical liquid with a product name: ICP Clean S-135K at a concentration of 150 ml/L at a temperature of 40° C.) for a time of four minutes, (3) in a soft-etching process, immersing in a soft-etching liquid (for example, a chemical liquid of persulfuric acid soda at a concentration of 100 g/L at a temperature of 25° C.) for a time of 30 seconds, (4) in a desmutting process, immersing in a chemical liquid, for example, setting 98% sulfuric acid at a concentration of 100 ml/L at a temperature of 25° C. for a time of 30 seconds, (5) in a pre-dipping process, immersing in a liquid setting 35% hydrochloric acid at a concentration of 100 ml/L at a temperature of 25° C. for a time of 30 seconds, and (6) in a catalyst addition process, immersing in a catalyst liquid (for example, a chemical liquid with a product name: ICP accera at a concentration of 200 ml/L at a temperature of 25° C.) for a time of 30 seconds.

Next, (7) in an electroless nickel-phosphorus (Ni—P) plating process, a nickel-phosphorus layer is formed. In this process, the nickel-phosphorus layers each with a film thickness of about 5 μm are formed in each of six stages of plating processes in total where the pH of a plating solution is changed in a range of 4.5 to 6.5, a temperature is changed in a range of 80° C. to 88° C., an Ni concentration of the plating solution is changed in a range of 5.0 to 6.7 g/L, and time is changed in a range of 15 to 40 minutes. It goes without saying that the values are just examples, and values other than the above are acceptable.

(8) in an electroless Au plating process, a gold layer with a film thickness of about 0.06 μm is formed by immersing in a plating solution with, for example, a pH of 4.8, at the temperature of 80° C., a concentration of gold (Au) of 1.2 g/L for 10 minutes.

Finally, (9) in a drying process, a preparation of a substrate is completed.

According to the above-stated processes, a transmission path or a radiation element having the structures illustrated in FIG. 2 and FIG. 10 can be formed.

In the above embodiments, the microstrip transmission path is made by forming the transmission path 12 at the upper side surface of the dielectric substrate 11, and the ground layer 19 is formed at the lower side surface as illustrated in FIG. 2, but a coplanar transmission path may be formed. Even in such a case, the loss can be reduced with respect to the high-frequency signals of over 8 GHz.

Other elements may be contained in the nickel-phosphorus layer in a range not impairing an effect obtained by the present invention. For example, the effect of the present invention can be exerted even if elements such as Fe, Zn, Cr are contained in the nickel-phosphorus layer at a minute amount (for example within 1%).

In each of the above embodiments, the transmission path 12 in FIG. 2 has a three-layer structure of the copper layer 121 in FIG. 2, the nickel-phosphorus layer 122 in FIG. 2, and the gold layer 123 in FIG. 2, but may have a structure where, for example, only the nickel-phosphorus layer 122 in FIG. 2 is held at the surface of the dielectric substrate 11 in FIG. 2. The nickel-phosphorus layer 122 in FIG. 2 may be combined with at least one of the copper layer 121 in FIG. 2 or the gold layer 123 in FIG. 2. Even in such a structure, it is possible to reduce the loss with respect to the high-frequency signals of over 8 GHz.

In each of the above embodiments, the nickel-phosphorus layer 122 in FIG. 2 is formed by the electroless plating, but it may be formed by, for example, electroplating, vacuum deposition, and the like other than the electroless plating.

The nickel-phosphorus layer 122 may have an amorphous form or a crystalline form.

A layer formed of other metals such as, for example, aluminum may be formed instead of the copper layers 121, 191 in FIG. 2. Other metals such as, for example, platinum may be used instead of the gold layers 123, 193 in FIG. 2, or the gold layers 123, 193 in FIG. 2 may not exist.

In each of the above embodiments, it is explained while exemplifying the case when the signals transmitted through the transmission path are digital signals, but the similar effect can be expected even when analog signals are transferred. The loss can be reduced regarding the high-frequency signal component of over 8 GHz as long as the high-frequency signal component of over 8 GHz is contained even if other frequency components are contained.

In each of the above embodiments, it is explained while exemplifying the transmission path transmitting electrical signals, but the present invention can be applied to, for example, a waveguide transmitting electromagnetic waves as illustrated in FIGS. 8(A) and 8(B). In an example in FIGS. 8(A) and 8(B), a waveguide 70 is formed by a hollow member 71 which is formed to have a rectangular (or circular) shape with a plate-like member having conductivity (for example, copper or aluminum), as illustrated in FIG. 8(A). A nickel-phosphorus layer 72 is formed on an internal surface of the hollow member 71 as a cross-section thereof is enlarged and illustrated in FIGS. 8(A) and 8(B). The nickel-phosphorus layer 72 is formed by electroless plating or the like as same as the above-stated cases, and the phosphorus concentration is set to be over 0 mass % and less than 8 mass %. According to such an embodiment, a loss of the electromagnetic waves transmitted through the waveguide 70 can be reduced.

In the third and fourth embodiments, it is explained that while exemplifying the transmitting antenna device, the present invention may also be applied to a receiving antenna device. According to such a structure, reception gain can be improved.

In the third and fourth embodiments, the radiation element 82 in FIG. 10, the ground conductor plates 84 in FIG. 10, 211 in FIG. 14, the power feeding parts 223 in FIG. 13, 324 in FIG. 15, and the short-circuit parts 222 in FIG. 13, 325 in FIG. 15 each have a three-layer structure of the copper layer 821 in FIG. 10, the nickel-phosphorus layer 822 in FIG. 10, and the gold layer 823 in FIG. 10, but for example, a structure where only the nickel-phosphon1s layer 822 in FIG. 10 is held on a surface of the dielectric substrate 81 in FIG. 10 may be used. The nickel-phosphorus layer 822 in FIG. 10 may be combined with at least one of the copper layer 821 in FIG. 10 or the gold layer 823 in FIG. 10. Accordingly, such a structure can improve the gain when the high-frequency signals of over 8 GHz are transmitted/received.

In the third and fourth embodiments, it is explained that while exemplifying the patch antenna, the plate-like inverse F antenna, and the inverse F antenna, the present invention may also be applied to, for example, a normal mode helical antenna, where a λ/4 monopole antenna is made into a spiral pattern to shorten a total length, an inverse L antenna which is made low-profile by bending the λ/4 monopole antenna, and the like. It goes without saying that the present invention may be applied to antenna devices other than those described above.

In each of the above embodiments, all of the radiation element 82, the power feeding line 83, and the ground conductor plate 84 each have the stacked structure illustrated in FIG. 10, but at least one of the above may have the stacked structure illustrated in FIG. 10. In FIG. 13 and FIG. 14, at least a part of the radiation element 221, the short-circuit part 222, and the power feeding part 223 may have the stacked structure illustrated in FIG. 10, and in FIG. 15, at least a part of the radiation element 323, the power feeding part 324, the short-circuit part 325, and the ground conductor 326 may have the stacked structure illustrated in FIG. 10.

In each structural example in FIG. 9, FIG. 13, and FIG. 14, an IC or a circuit element (resistance, capacitor, coil, and other elements) may be mounted on the ground conductor plates 84, 211 as same as FIG. 15.

EXPLANATION OF REFERENCE SIGNS 10 backplane substrate
11 dielectric substrate
12 transmission path
13, 14 via
15, 17 connector
16, 18 transmission path
20, 30 unit substrate
21, 31 dielectric substrate
10 22, 32 transmission path
23, 24, 33, 34 via
25, 35 IC chip
36 circuit element
50 optical/electrical converter
51 dielectric substrate
52 connector
53 transmission path
54 optical/electrical converting part
55 optical fiber
56, 57 and 58 electronic component
70 waveguide
71 hollow member
72 nickel-phosphorus layer
80 antenna device
81 dielectric substrate
82 radiation element
83 power feeding line
84 ground conductor plate
121, 191 copper layer
122, 192 nickel-phosphorus layer
123, 193 gold layer

The invention claimed is:

1. A transmission path which transmits high-frequency signals with each signal containing a frequency component of 14 GHz or more, the transmission path comprising:
a nickel-phosphorus layer containing nickel and phosphorus, wherein
a phosphorus concentration of the nickel-phosphorus layer is over 0 mass % and less than 8 mass %.

2. The transmission path according to claim 1, wherein the phosphorus concentration of the nickel-phosphorus layer is 6 mass % or less.

3. The transmission path according to claim 1, wherein the phosphorus concentration of the nickel-phosphorus layer is 4 mass % or less.

4. The transmission path according to claim 1, wherein the phosphorus concentration of the nickel-phosphorus layer is 3 mass % or less.

5. The transmission path according to claim 1, wherein the phosphorus concentration of the nickel-phosphorus layer is 0.5 mass % or more and less than 8 mass %.

6. The transmission path according to claim 1, wherein the phosphorus concentration of the nickel-phosphorus layer is 1.0 mass % or more and less than 8 mass %.

7. The transmission path according to claim 1, further comprising:
a conductor layer, wherein
the nickel-phosphorus layer is formed on a surface of the conductor layer.

8. The transmission path according to claim 7, wherein the conductor layer is formed of copper.

9. The transmission path according to claim 1, wherein the nickel-phosphorus layer is formed on a surface of a dielectric substrate.

10. The transmission path according to claim 1, further comprising:
a gold layer formed on a surface of the nickel-phosphorus layer.

11. The transmission path according to claim 1, wherein digital signals with each digital signal corresponding to one of the high-frequency signals and having a transmission speed of over 28 Gbaud are transmitted through the transmission path.

12. The transmission path according to claim 1, wherein the nickel-phosphorus layer is formed on an inner surface of a waveguide.

13. The transmission path according to claim 1, wherein the nickel-phosphorus layer is formed by electroless plating.

14. The transmission path according to claim 1, the transmission path forming at least a radiation element of an antenna device including: the radiation element transmitting/receiving the high-frequency signals; a ground conductor plate disposed adjacent to the radiation element; and a power feeding part feeding electric power to the radiation element or receiving electric power from the radiation element.

15. A transmission path which transmits high-frequency signals with each signal containing a frequency component of over 8 GHz, the transmission path comprising:
a nickel-phosphorus layer containing nickel and phosphorus, wherein
a phosphorus concentration of the nickel-phosphorus layer is over 0 mass % and 3 mass % or less.

16. A transmission path which transmits high-frequency signals with each signal containing a frequency component of over 8 GHz, the transmission path comprising:
a nickel-phosphorus layer containing nickel and phosphorus, wherein
a phosphorus concentration of the nickel-phosphorus layer is over 0 mass % and less than 8 mass %, and the nickel-phosphorus layer is formed on an inner surface of a waveguide.

17. A transmission path which transmits high-frequency signals with each signal containing a frequency component of over 8 GHz, the transmission path comprising:
a nickel-phosphorus layer containing nickel and phosphorus, wherein
a phosphorus concentration of the nickel-phosphorus layer is over 0 mass % and less than 8 mass %, and the transmission path forming forms at least a radiation element of an antenna device including: the radiation element transmitting/receiving the high-frequency signals; a ground conductor plate disposed adjacent to the radiation element; and a power feeding part feeding electric power to the radiation element or receiving electric power from the radiation element.

\* \* \* \* \*